United States Patent
Wang et al.

(10) Patent No.: US 6,248,647 B1
(45) Date of Patent: Jun. 19, 2001

(54) FABRICATION OF INTEGRATED CIRCUITS ON BOTH SIDES OF A SEMICONDUCTOR WAFER

(75) Inventors: Lei Wang, Sunnyvale; Weizhong Wang, Mountain View, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/270,257

(22) Filed: Mar. 15, 1999

(51) Int. Cl.$^7$ .......................... H01L 21/46; H01L 21/78; H01L 21/301
(52) U.S. Cl. .................... 438/460; 438/107; 438/424; 438/584
(58) Field of Search ............................ 438/460, 462, 438/107, 424, 435, 443, 584, 618

(56) References Cited

U.S. PATENT DOCUMENTS 5,817,530 * 10/1998 Ball .

* cited by examiner

Primary Examiner—Kevin M. Picardat
Assistant Examiner—D. M. Collins
(74) Attorney, Agent, or Firm—Monica H. Choi

(57) ABSTRACT

The present invention compactly fabricates integrated circuits of an electronic system on a semiconductor wafer by fabricating the integrated circuits of the electronic system on both sides of a semiconductor wafer. A first face of an area of the semiconductor wafer is processed with an integrated circuit fabrication process step to fabricate part of a first integrated circuit thereon. In addition, a second face of the area of the semiconductor wafer is processed with the integrated circuit fabrication process step to fabricate part of a second integrated circuit thereon. The first face and the second face are processed for a plurality of integrated circuit fabrication process steps until the first integrated circuit is completely fabricated on the first face and the second integrated circuit is completely fabricated on the second face. The first face and the second face of the area of the semiconductor wafer may both be processed simultaneously or may be processed one face at a time depending on the fabrication process step. That area of the semiconductor wafer is then cut from the rest of the semiconductor wafer such that the first integrated circuit and the second integrated circuit are on a die to be used within an electronic system. The present invention may be used to particular advantage when the first integrated circuit includes at least one processor and when the second integrated circuit includes at least one processor. In that case, the die having the first integrated circuit and the second integrated circuit is used within a multiprocessor system. With the present invention, integrated circuits of an electronic system are compactly fabricated onto both sides of a semiconductor wafer.

8 Claims, 2 Drawing Sheets

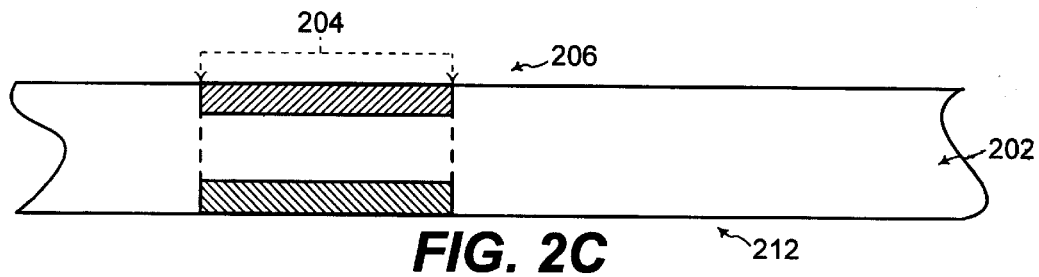
FIG. 2C
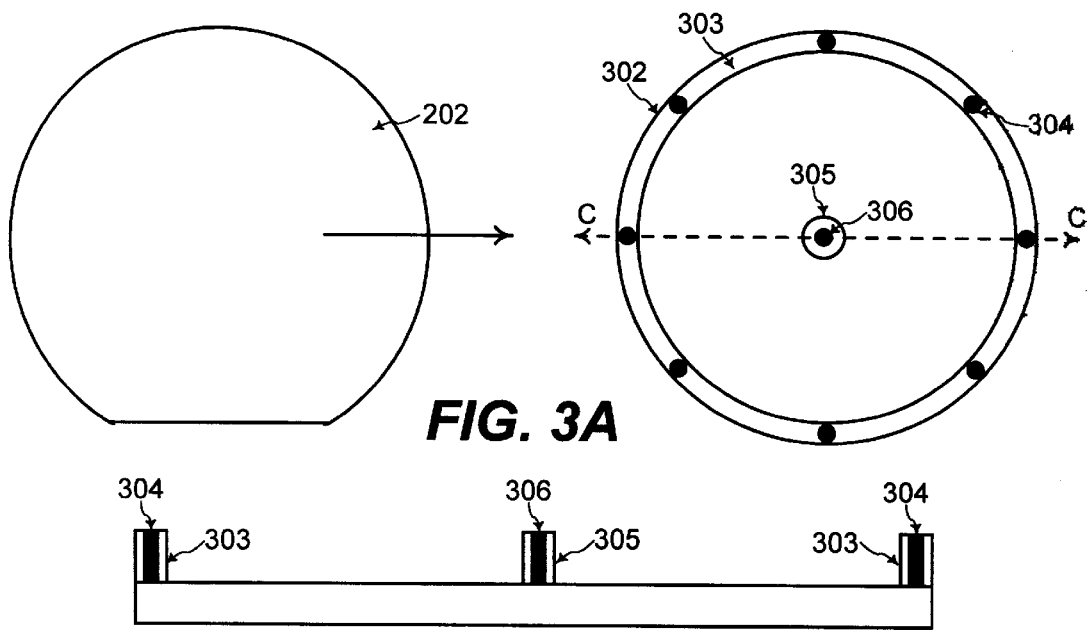
FIG. 3A
FIG. 3B
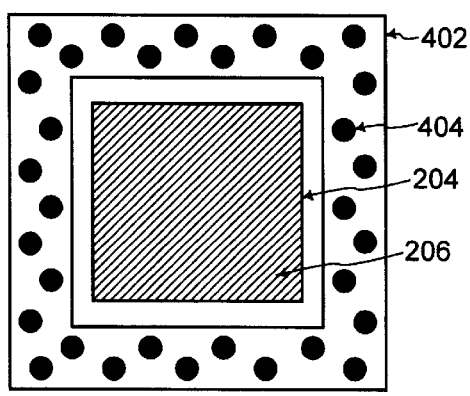
FIG. 4A
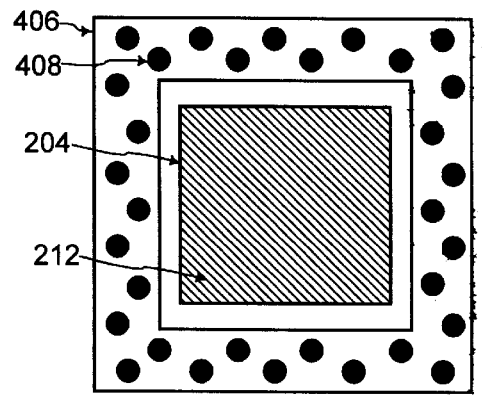
FIG. 4B

FABRICATION OF INTEGRATED CIRCUITS ON BOTH SIDES OF A SEMICONDUCTOR WAFER

TECHNICAL FIELD

The present invention relates generally to integrated circuit fabrication, and more particularly, to fabrication of integrated circuits on both sides of a semiconductor wafer for more efficient integrated circuit fabrication and for enhanced performance of integrated circuits.

BACKGROUND OF THE INVENTION

As device densities continually increase on a semiconductor wafer, the trend is to incorporate multiple circuits into a single monolithic integrated circuit. For example, current computer systems run four or eight processors, and those plurality of processors are fabricated on a single monolithic integrated circuit. In the future, a computer system will likely run an even larger number of processors in a multiprocessor system. Incorporation of a larger number of processors into a single monolithic integrated circuit increases the volume on a semiconductor wafer occupied by the plurality of processors.

Referring to FIG. 1A, an integrated circuit such as a multiprocessor system is fabricated on an area 102 of a semiconductor wafer 104. Referring to FIG. 1B, a cross sectional view of the semiconductor wafer 104 along line A—A of FIG. 1A shows the area 102 having the integrated circuit fabricated on a first face 106 of the semiconductor wafer 104. In the prior art, integrated circuits are fabricated on only one side of a semiconductor wafer.

In the prior art where integrated circuits are fabricated on only one side of a semiconductor wafer, as larger numbers of integrated circuits for an electronic system are incorporated into a single monolithic integrated circuit, the volume on a semiconductor wafer occupied by the plurality of integrated circuits for the electronic system increases. Thus, fewer dies of electronic systems fit onto a semiconductor wafer with larger numbers of integrated circuits. The rate of manufacture of the number of dies fabricated per semiconductor wafer decreases.

However, more integrated circuits may need to be incorporated into a die as electronic systems advance in technology. Thus, a means for compactly fabricating a plurality of integrated circuits of an electronic system on a semiconductor wafer is desired.

SUMMARY OF THE INVENTION

Accordingly, a primary object of the present invention is to compactly fabricate integrated circuits of an electronic system on a semiconductor wafer by fabricating the integrated circuits of the electronic system on both sides of a semiconductor wafer.

In a general aspect of the present invention, a first face of an area of the semiconductor wafer is processed with an integrated circuit fabrication process step to fabricate part of a first integrated circuit thereon. In addition, a second face of the area of the semiconductor wafer is processed with the integrated circuit fabrication process step to fabricate part of a second integrated circuit thereon. The first face and the second face are processed for a plurality of integrated circuit fabrication process steps until the first integrated circuit is completely fabricated on the first face and the second integrated circuit is completely fabricated on the second face. The first face and the second face of the area of the semiconductor wafer may both be processed simultaneously or may be processed one face at a time depending on the fabrication process step. That area of the semiconductor wafer is then cut from the rest of the semiconductor wafer when the first integrated circuit is completely fabricated on the first face and when the second integrated circuit is completely fabricated on the second face such that the first integrated circuit and the second integrated circuit are on a die to be used within an electronic system.

The first integrated circuit may be interconnected with the second integrated circuit such that the first integrated circuit functionally interacts with the second integrated circuit within the electronic system.

The present invention may be used to particular advantage when the first integrated circuit includes at least one processor and when the second integrated circuit includes at least one processor. In that case, the die having the first integrated circuit and the second integrated circuit is used within a multiprocessor system.

With the present invention, the first face of the area of the semiconductor wafer and the second face of the area of the semiconductor wafer may both be processed simultaneously during an integrated fabrication process step which includes a selected one of wet cleaning, wet etching, thermal film deposition, LPCVD (Low Pressure Chemical Vapor Deposition) film deposition, drive-in diffusion doping, and rapid thermal annealing. Such simultaneous processing of both faces at one time results in more efficient fabrication of a larger area of the semiconductor wafer with less time. In addition, such simultaneous processing of both faces at one time reduces variations in fabrication parameters from wafer to wafer. Such higher uniformity from wafer to wafer results in better system performance for systems with multiple dies because of better matching between the multiple dies.

Alternatively, the first face of the area of the semiconductor wafer and the second face of the area of the semiconductor wafer may be processed one face at a time during an integrated circuit fabrication process step which includes a selected one of patterning, dry etching, implantation, PVD (Physical Vapor Deposition) film deposition, and CMP (Chemical Mechanical Polish). In that case the semiconductor wafer may be placed on an edge rim vacuum chuck such that the other side of the semiconductor wafer is not damaged while one side of the semiconductor wafer is being processed.

A first CPGA (Ceramic Pin Grid Array) package may be attached to the first face of the die with a first set of pins from the first CPGA package being coupled to pads from the first integrated circuit on the first face of the die. A second CPGA (Ceramic Pin Grid Array) package may be attached to the second face of the die with a second set of pins from the second CPGA package being coupled to pads from the second integrated circuit on the second face of the die.

In this manner, integrated circuits of an electronic system are fabricated onto both sides of a semiconductor wafer. Thus, as the number of integrated circuits in an electronic system increases, the integrated circuits are fabricated compactly on the semiconductor wafer, and the volume occupied by those integrated circuits on the semiconductor wafer is minimized. With fabrication of integrated circuits onto both sides of a semiconductor wafer, a larger number of electronic systems fit onto a semiconductor wafer such that the rate of manufacture of the number of dies fabricated per semiconductor wafer increases.

These and other features and advantages of the present invention will be better understood by considering the following detailed description of the invention which is presented with the attached drawings.

BRIEF DESCRIPTION OF THE DRAWINGS

FIG. 2C shows a cross sectional view of the semiconductor wafer of FIGS. 2A and 2B having the area with integrated circuits of an electronic system fabricated on the first face and on the second face of the semiconductor wafer, according to the present invention;

FIG. 3A shows a top view of an edge rim vacuum chuck used when the first face of the semiconductor wafer and the second face of the semiconductor wafer are processed one face at a time, according to the present invention;

FIG. 3B shows a cross sectional view of the edge rim vacuum chuck of FIG. 3A, according to the present invention;

FIG. 4A shows a first CPGA (Ceramic Pin Grid Array) package attached to the first face of the die having the area with integrated circuits of an electronic system fabricated on the first face, according to the present invention; and FIG. 4B shows a second CPGA (Ceramic Pin Grid Array) package attached to the second face of the die having the area with integrated circuits of an electronic system fabricated on the second face, according to the present invention.

The figures referred to herein are drawn for clarity of illustration and are not necessarily drawn to scale. Elements having the same reference number in FIGS. 1A, 1B, 2A, 2B, 2C, 3A, 3B, 4A, and 4B refer to elements having similar structure and function.

DETAILED DESCRIPTION

Figure 1A:
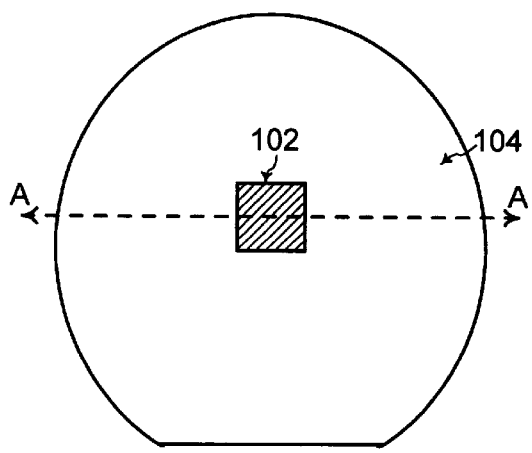
FIG. 1A shows a top view of a semiconductor wafer having an area with integrated circuits of an electronic system die fabricated thereon.
Figure 1B:
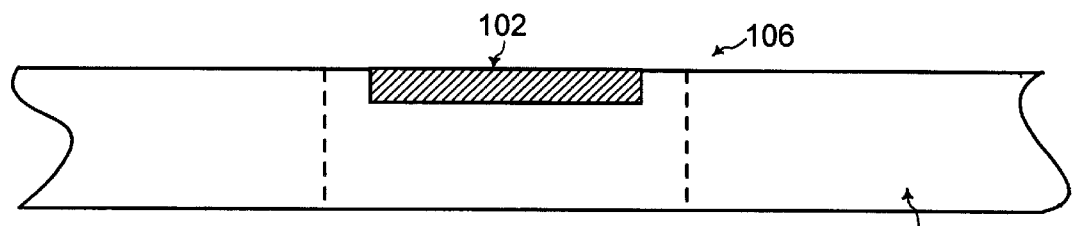
FIG. 1B shows a cross sectional view of the area with the integrated circuits of an electronic system fabricated on only one side of the semiconductor wafer, in accordance with the prior art.
Figure 2A:
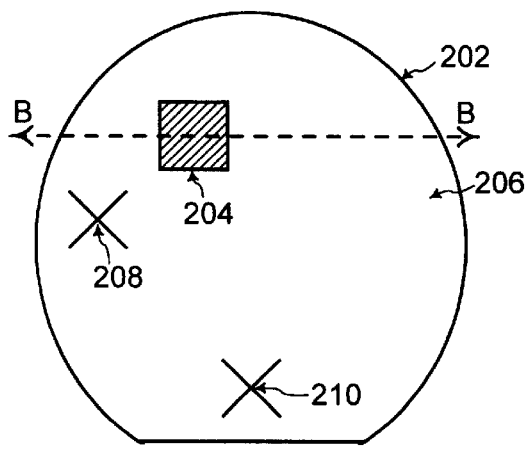
FIG. 2A shows a first face of a semiconductor wafer having an area with integrated circuits of an electronic system fabricated on the first face and on a second face of the semiconductor wafer, according to the present invention.

Referring to FIG. 2A, integrated circuits are fabricated on a semiconductor wafer 202. In typical fabrication of integrated circuits on a semiconductor wafer, the integrated circuits for an electronic system are fabricated as a die on the semiconductor wafer. The die is then cut from the rest of the semiconductor wafer for use within the electronic system.

In the present invention, integrated circuits for an electronic system are fabricated on both sides of a semiconductor wafer. Referring to FIG. 2A, an area 204 on the semiconductor wafer 202 defines a die that holds the integrated circuits for an electronic system. A first face 206 of the area 204 of the semiconductor wafer 202 has a first integrated circuit fabricated thereon. A first marker 208 and a second marker 210 are on the first face of the semiconductor wafer 202 for illustrating the relative position of the area 204 on the semiconductor wafer 202.

Figure 2B:
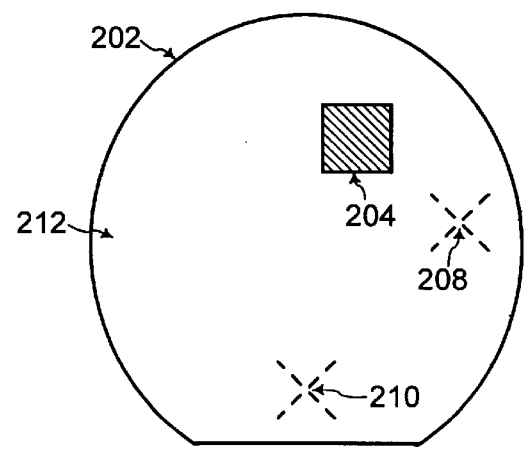
FIG. 2B shows the second face of the semiconductor wafer of FIG. 2A having the area with integrated circuits of the electronic system fabricated on the second face, according to the present invention.

Referring to FIG. 2B, a second face 212 of the semiconductor wafer 202 of FIG. 2A is shown. The second face 212 in FIG. 2B is the semiconductor wafer 202 of FIG. 2A flipped over as indicated by the dashed first marker 208 and the dashed second marker 210 as reference points. The second face 212 of the area 204 of the semiconductor wafer 202 has a second integrated circuit fabricated thereon.

Referring to FIG. 2C, a cross sectional view is shown for the area 204 of the semiconductor wafer 202 across the line B—B of FIG. 2A. As shown in this cross sectional view, the first face 206 of the area 204 of the semiconductor wafer 202 has a first integrated circuit fabricated thereon, and the second face 212 of the area 204 of the semiconductor wafer 202 has a second integrated circuit fabricated thereon.

The area 204 defines a die holding integrated circuits for an electronic system. Once the integrated circuits of the electronic system are fabricated on the first face 206 and the second face 212 of the area 204 of the semiconductor wafer 202, the area 204 of the semiconductor wafer 202 is cut from the rest of the semiconductor wafer 202. The first integrated circuit fabricated on the first face 206 and the second integrated circuit fabricated on the second face 212, of the area 204 of the semiconductor wafer 202, are then on the die to be used within the electronic system.

During some integrated circuit fabrication process steps of the first integrated circuit on the first face 206 and the second integrated circuit on the second face 212, of the area 204 of the semiconductor wafer 202, the first face 206 and the second face 212 may both be processed simultaneously at the same time. Integrated circuit fabrication process steps which are amenable for simultaneous fabrication of both the first face 206 and the second face 212 at substantially the same time include wet cleaning, wet etching, thermal film deposition, LPCVD (Low Pressure Chemical Vapor Deposition) film deposition, drive-in diffusion doping, and rapid thermal annealing, as would be apparent to one of ordinary skill in the art of integrated circuit fabrication. Other types of fabrication process steps aside from the examples mentioned herein may be known to one of ordinary skill in the art to be amenable for simultaneous processing of the first face 206 and the second face 212 of the area 204 of the semiconductor wafer 202.

Simultaneous processing of both faces at one time results in more efficient fabrication of a larger area of the semiconductor wafer with less time. In addition, such simultaneous processing of both faces at one time reduces variations in fabrication parameters from wafer to wafer. Such higher uniformity from wafer to wafer results in better system performance for systems with multiple dies because of better matching between the multiple dies.

For other types of fabrication process steps, the first face 206 and the second face 212 may be processed one face at a time. Integrated circuit fabrication process steps which may require fabrication of the first face 206 and the second face 212 one face at a time include patterning, dry etching, implantation, PVD (Physical Vapor Deposition) film deposition, and CMP (Chemical Mechanical Polish), as would be apparent to one of ordinary skill in the art of integrated circuit fabrication. Other types of fabrication process steps aside from the examples mentioned herein may be known to one of ordinary skill in the art to be amenable for processing of the first face 206 and the second face 212 of the area 204 of the semiconductor wafer 202, one face at a time. For such fabrication process steps, one side of the semiconductor wafer 202 is processed with such a fabrication process step, and then the semiconductor wafer 202 is turned over such that the other side of the semiconductor wafer 202 is processed with that fabrication process step.

During any fabrication process steps when the first face 206 and the second face 212 are processed one face at a time, the semiconductor wafer 202 may be placed on an edge rim vacuum chuck 302 as shown in FIG. 3A. The edge rim vacuum chuck 302 is comprised of an edge support 303 which contacts one side of the semiconductor wafer 202 only toward the edge of the semiconductor wafer 202. A plurality of vacuum suction holes 304 are disposed around the edge support 303 to firmly hold the semiconductor wafer 202 to the edge rim vacuum chuck 302. A center support 305 with a vacuum suction hole 306 may also be present in the center of the edge rim vacuum chuck 302 for further contacting and supporting the center of the semiconductor wafer 202. Alternatively, mechanical clips may be used to hold the semiconductor wafer 202 during some processing steps when the first face 206 and the second face 212 are processed one face at a time.

FIG. 3B shows a cross sectional view of the edge rim vacuum chuck 302 across line C—C of FIG. 3A. When a face of the semiconductor wafer 202 contacts and is supported by the edge support 303 and the center support 305, areas of that face of the semiconductor wafer 202 which do not contact the edge support 303 and the center support 305 are preserved from being damaged. Thus, the semiconductor wafer 202 may be processed one face at a time with the edge rim vacuum chuck 302 while integrated circuit structures on the face which is not currently being processed are preserved from being damaged.

The edge rim vacuum chuck 302 may not include the center support 305 depending on the stress distribution across the semiconductor wafer 202 when the semiconductor wafer 202 is placed on the edge rim vacuum chuck 302. When the center support 305 is included, the center area of the semiconductor wafer 202 which contacts the center support 305 is sacrificed.

Once the integrated circuits of an electronic system are completely fabricated on the first face 206 and the second face 212 of the area 204 of the semiconductor wafer 202, the area 204 of the semiconductor wafer 202 is cut from the rest of the semiconductor wafer 202 as a die. That die is then packaged for use within the electronic system. Referring to FIG. 4A, a first CPGA (Ceramic Pin Grid Array) package 402 is attached to the first face 206 of the die 204. A CPGA (Ceramic Pin Grid Array) package has an array of pins which are coupled to pads from the integrated circuit on the die, as known to one of ordinary skill in the art. Referring to FIG. 4A, the first CPGA package 402 has a plurality of pins 404 which are coupled to pads from the first integrated circuit on the first face 206 of the die 204 in a manner known to one of ordinary skill in the art.

Referring to FIG. 4B, a second CPGA (Ceramic Pin Grid Array) package 406 is attached to the second face 212 of the die 204. The second CPGA package 406 has a plurality of pins 408 which are coupled to pads from the second integrated circuit on the second face 212 of the die 204 in a manner known to one of ordinary skill in the art. The die 204 is then sandwiched between the first CPGA package 402 and the second CPGA package 406.

In this manner, integrated circuits of an electronic system are fabricated onto both sides of a semiconductor wafer. Thus, as the number of integrated circuits in a die increases, the integrated circuits are fabricated compactly on the semiconductor wafer, and the volume occupied by those integrated circuits on the semiconductor wafer is minimized. In addition, with fabrication of integrated circuits onto both sides of a semiconductor wafer, a larger number of electronic systems fits onto a semiconductor wafer such that the rate of manufacture of the number of electronic systems fabricated per semiconductor wafer increases.

The present invention is particularly amenable for fabrication of multiprocessor systems which include a plurality of processors fabricated on a single monolithic integrated circuit. In that case, referring to FIG. 2C, the first integrated circuit fabricated on the first face 206 of the area 204 of the semiconductor wafer 202 includes at least one processor of a multiprocessor system. In addition, the second integrated circuit fabricated on the second face 212 of the area 204 of the semiconductor wafer 202 also includes at least one processor of the multiprocessor system. The plurality of processors of the multiprocessor system are fabricated on the two sides of the area 204 of the semiconductor wafer 202.

The present invention is particularly amenable for fabrication of multiprocessor systems because multiple processors are fabricated on a semiconductor wafer by repetitive step patterning for each processor within the multiprocessor system, as known to one of ordinary skill in the art. This repetitive step patterning may be easily applied on both sides of the semiconductor wafer. In addition, with repetitive step patterning, the processors of a multiprocessor system may easily be aligned on both sides of the semiconductor wafer to fit within an area of a die.

With the present invention, the multiprocessor system having a plurality of processors is compactly fabricated onto a smaller area of the semiconductor wafer. As the number of processors increases in a multiprocessor system, those processors are more likely to fit within one die with the present invention. Thus, the interconnections between the processors of the multiprocessor system are more compact with the present invention leading to lower stray resistance and/or capacitance within the multiprocessor system. Lower stray resistance and/or capacitance results in higher system speed as known to one of ordinary skill in the art of electronic systems.

Referring to FIGS. 4A and 4B for example, interconnect for coupling the first integrated circuit on the first face 206 of the die 204 and the second integrated circuit on the second face 212 of the die 204 may be through the pins 404 of the first CPGA package 402 and the pins 408 of the second CPGA package 406. With such interconnect, the first integrated circuit on the first face 206 of the die 204 may functionally interact with the second integrated circuit on the second face 212 of the die 204. Because such interconnect is within the same or nearby package, such interconnect has lower stray resistance and/or capacitance.

The foregoing is by way of example only and is not intended to be limiting. For example, the present invention may be used for fabricating any types of integrated circuits within any type of electronic systems. Processors within an multiprocessor system are by way of example only. In addition, the die having integrated circuits fabricated on both sides of that die may be packaged in any type of integrated circuit package which is amenable for packaging dies having integrated circuits fabricated on both sides of the die. The CPGA package is by way of example only.

Furthermore, as will be understood by those skilled in the art, the integrated circuit structures described herein may be made or used in the same way regardless of their position and orientation. Accordingly, it is to be understood that terms and phrases such as "top view" and "side" as used herein refer to the relative location and orientation of various portions of the structures with respect to one another, and are not intended to suggest that any particular absolute orientation with respect to external objects is necessary or required. The invention is limited only as defined in the following claims and equivalents thereof.

We claim:

1. A method for compactly fabricating integrated circuits on a semiconductor wafer, the method including the steps of:
   A. processing a first face of an area of said semiconductor wafer with an integrated circuit fabrication process step to fabricate part of a first integrated circuit thereon, wherein said first integrated circuit includes active integrated circuit devices fabricated into said area of said first face of said semiconductor wafer;
   B. processing a second face of said area of said semiconductor wafer with said integrated circuit fabrication process step to fabricate part of a second integrated circuit thereon, wherein said second integrated circuit includes active integrated circuit devices fabricated into said area of said second face of said semiconductor wafer;
   C. repeating steps A and B for a plurality of integrated circuit fabrication process steps until said first integrated circuit is completely fabricated on said first face and said second integrated circuit is completely fabricated on said second face; and
   D. cutting said area of said semiconductor wafer from rest of said semiconductor wafer when said first integrated circuit is completely fabricated on said first face and when said second integrated circuit is completely fabricated on said second face such that said first integrated circuit and said second integrated circuit are on a die to be used within an electronic system.

2. The method of claim 1, further including the step of:
   interconnecting said first integrated circuit with said second integrated circuit such that said first integrated circuit functionally interacts with said second integrated circuit within said electronic system.

3. The method of claim 1, wherein said first integrated circuit includes at least one processor and wherein said second integrated circuit includes at least one processor, and wherein said die having said first integrated circuit and said second integrated circuit is used within a multiprocessor system.

4. The method of claim 1, wherein said first face of said area of said semiconductor wafer and said second face of said area of said semiconductor wafer are both processed simultaneously during an integrated fabrication process step which includes a selected one of wet cleaning, wet etching, thermal film deposition, LPCVD (Low Pressure Chemical Vapor Deposition) film deposition, drive-in diffusion doping, and rapid thermal annealing.

5. The method of claim 1, wherein said first face of said area of said semiconductor wafer and said second face of said area of said semiconductor wafer are processed one face at a time during an integrated fabrication process step which includes a selected one of patterning, dry etching, implantation, PVD (Physical Vapor Deposition) film deposition, and CMP (Chemical Mechanical Polish).

6. The method of claim 5, further including the step of:
   placing said semiconductor wafer on an edge rim vacuum chuck when said first face of said area of said semiconductor wafer and said second face of said area of said semiconductor wafer are processed one face at a time.

7. The method of claim 1, further including the steps of:
   attaching a first CPGA (Ceramic Pin Grid Array) package to said first face of said die, wherein a first set of pins from said first CPGA package are coupled to pads from said first integrated circuit on said first face of said die; and
   attaching a second CPGA (Ceramic Pin Grid Array) package to said second face of said die, wherein a second set of pins from said second CPGA package are coupled to pads from said second integrated circuit on said second face of said die.

8. A method for compactly fabricating a multiprocessor system on a semiconductor wafer, the method including the steps of:
   A. processing a first face of an area of said semiconductor wafer with an integrated circuit fabrication process step to fabricate part of a first integrated circuit including a first processor thereon, wherein said first integrated circuit includes active integrated circuit devices fabricated into said area of said first face of said semiconductor wafer;
   B. processing a second face of said area of said semiconductor wafer with said integrated circuit fabrication process step to fabricate part of a second integrated circuit including a second processor thereon, wherein said second integrated circuit includes active integrated circuit devices fabricated into said area of said second face of said semiconductor wafer;
   C. repeating steps A and B for a plurality of integrated circuit fabrication process steps until said first integrated circuit is completely fabricated on said first face and said second integrated circuit is completely fabricated on said second face;
   D. cutting said area of said semiconductor wafer from rest of said semiconductor wafer when said first integrated circuit is completely fabricated on said first face and when said second integrated circuit is completely fabricated on said second face such that said first integrated circuit and said second integrated circuit are on a die that forms said multiprocessor system;
   E. interconnecting said first processor with said second processor such that said first processor functionally interacts with said second processor within said multiprocessor system;
   wherein said first face of said area of said semiconductor wafer and said second face of said area of said semiconductor wafer are both processed simultaneously during an integrated fabrication process step which includes a selected one of wet cleaning, wet etching, thermal film deposition, LPCVD (Low Pressure Chemical Vapor Deposition) film deposition, drive-in diffusion doping, and rapid thermal annealing;
   wherein said first face of said area of said semiconductor wafer and said second face of said area of said semiconductor wafer are processed one face at a time during an integrated fabrication process step which includes a selected one of patterning, dry etching, implantation, PVD (Physical Vapor Deposition) film deposition, and CMP (Chemical Mechanical Polish);
   F. placing said semiconductor wafer on an edge rim vacuum chuck when said first face of said area of said semiconductor wafer and said second face of said area of said semiconductor wafer are processed one face at a time;
   G. attaching a first CPGA (Ceramic Pin Grid Array) package to said first face of said die, wherein a first set of pins from said first CPGA package are coupled to pads from said first integrated circuit on said first face of said die; and
   H. attaching a second CPGA (Ceramic Pin Grid Array) package to said second face of said die, wherein a second set of pins from said second CPGA package are coupled to pads from said second integrated circuit on said second face of said die.

* * * * *